(12) United States Patent
Lebert et al.

(10) Patent No.: US 11,615,897 B2
(45) Date of Patent: Mar. 28, 2023

(54) MICROSCOPIC SYSTEM FOR TESTING STRUCTURES AND DEFECTS ON EUV LITHOGRAPHY PHOTOMASKS

(71) Applicant: RI Research Instruments GmbH, Bergisch Gladbach (DE)

(72) Inventors: Rainer Lebert, Wipperfuerth (DE); Christoph Sebastian Phiesel, Bad Neuenahr-Ahrweiler (DE); Thomas Missalla, Jena (DE); Andreas Biermanns-Foeth, Overath (DE); Christian Piel, Lindlar (DE)

(73) Assignee: RI Research Institute GmbH, Bergisch Gladbach (DE)

( * ) Notice: Subject to any disclaimer, the term of this patent is extended or adjusted under 35 U.S.C. 154(b) by 0 days.

(21) Appl. No.: 17/760,684

(22) PCT Filed: Sep. 15, 2020

(86) PCT No.: PCT/DE2020/100801
§ 371 (c)(1),
(2) Date: Mar. 15, 2022

(87) PCT Pub. No.: WO2021/052533
PCT Pub. Date: Mar. 25, 2021

(65) Prior Publication Data
US 2022/0392660 A1 Dec. 8, 2022

Related U.S. Application Data

(60) Provisional application No. 62/901,165, filed on Sep. 16, 2019.

(30) Foreign Application Priority Data
Sep. 17, 2019 (DE) ..................... 10 2019 124 919.8

(51) Int. Cl.
*G21K 1/06* (2006.01)
*G03F 1/84* (2012.01)
(Continued)

(52) U.S. Cl.
CPC ............... *G21K 1/062* (2013.01); *G03F 1/84* (2013.01); *G03F 7/702* (2013.01); *G21K 1/10* (2013.01);
(Continued)

(58) Field of Classification Search
CPC .............. G21K 1/06; G21K 1/00; G21K 1/10; G21K 1/062; G21K 7/00; G21K 2201/061; G03F 7/20; G03F 7/702; G03F 1/84
See application file for complete search history.

(56) References Cited

U.S. PATENT DOCUMENTS

| 5,022,064 A | 6/1991 | Iketaki |
| 5,177,774 A | 1/1993 | Suckewer et al. |

(Continued)

FOREIGN PATENT DOCUMENTS

| DE | 101 30 212 A1 | 1/2003 |
| DE | 102 20 816 A1 | 11/2003 |

(Continued)

OTHER PUBLICATIONS

Feldmann, Heiko, et al., "Actinic Review of EUV Masks," *Proc. of SPIE*, vol. 7636, 11 pages (2010).
(Continued)

*Primary Examiner* — Jurie Yun
(74) *Attorney, Agent, or Firm* — Christensen, Fonder, Dardi & Herbert PLLC (57) ABSTRACT

A microscope system for flexibly, efficiently and quickly inspecting patterns and defects on extreme ultraviolet (EUV) lithography photomasks. The system includes a stand-alone plasma-based EUV radiation source with an emission spec-
(Continued)

trum with a freestanding line emission in the spectral range from 12.5 nm to 14.5 nm has a relative bandwidth of $\lambda/\Delta\lambda > 1000$, means for the broadband spectral filtering $\lambda/\Delta\lambda < 50$ for selecting the dominant freestanding emission line, means for suppressing radiation with wavelengths outside of the EUV spectral region, zone plate optics for magnified imaging of the object with a resolution which corresponds to the width of an outermost zone of the zone plate, a numerical aperture corresponding to more than 1000 zones, and a EUV detector array for capturing the patterned object.

11 Claims, 8 Drawing Sheets

(51) Int. Cl.
    *G03F 7/20*     (2006.01)
    *G21K 1/10*     (2006.01)
    *G21K 7/00*     (2006.01)

(52) U.S. Cl.
    CPC ......... *G21K 7/00* (2013.01); *G21K 2201/061* (2013.01)

(56) References Cited

U.S. PATENT DOCUMENTS

| | | |
|---|---|---|
| 5,222,113 A | 6/1993 | Thieme et al. |
| 5,311,565 A | 5/1994 | Horikawa |
| 6,469,827 B1 | 10/2002 | Sweatt et al. |
| 6,738,135 B1 | 5/2004 | Underwood et al. |
| 6,894,837 B2 | 5/2005 | Dobschal et al. |
| 9,476,841 B1 | 10/2016 | Antsiferov et al. |
| 2004/0174607 A1 | 9/2004 | Brunner et al. |

FOREIGN PATENT DOCUMENTS

| | | |
|---|---|---|
| DE | 103 19 269 A1 | 11/2004 |
| DE | 10 2007 041 939 A1 | 3/2009 |
| EP | 0 459 833 A2 | 12/1991 |
| EP | 0 459 833 B1 | 9/1996 |

OTHER PUBLICATIONS

Schriever, G., et al., "Laser-produced lithium plasma as a narrow-band extended ultraviolet radiation source for photoelectron spectroscopy," *Applied Optics*, vol. 37, No. 7, pp. 1243-1248 (Mar. 1, 1998).

>= 20 nm "resolution" zone plates are available

Fig. 8

MICROSCOPIC SYSTEM FOR TESTING STRUCTURES AND DEFECTS ON EUV LITHOGRAPHY PHOTOMASKS

PRIORITY CLAIM

The present application is a National Phase entry of PCT Application No. PCT/DE2020/100801, filed Sep. 15, 2020, which claims priority to U.S. Provisional Patent Application No. 62/901,165, filed Sep. 16, 2019, and to German Patent Application No. 10 2019 124 919.8, filed Sep. 17, 2019, the disclosures of which are hereby incorporated by reference herein in their entireties.

FIELD OF THE INVENTION

The invention is directed to a microscope system for inspecting patterns and defects on EUV lithography photomasks, particularly for reflective photomasks in EUV lithography (EUVL) with a spatial resolution of better than 50 nm.

At the present time, optical lithography is used to produce electronic chips in the semiconductor industry. Recently, extreme ultraviolet (EUV) lithography (EUVL) at $\lambda_{EUVL} \approx 13.5$ nm has been introduced in very modern chip production for the next generation of chips with minimum pattern sizes of 7 nm or less. The latest advances in EUVL have successfully carried out the lithography process using a stepper apparatus operating in a vacuum and multilayer coated reflection optics. In contrast to optical lithography, the processes of EUVL and actinic (influenced by radiation at a lithographic wavelength) inspection and checking can only be carried out in a vacuum, while the process steps of lithography and the following processing steps are similar in principle to optical lithography.

Masks for the EUVL process in the production of electronic chips use a "reflection mask". For this purpose, a EUV mask blank is produced initially in that a suitable defect-free substrate with low roughness is coated with a multilayer alternating-layer reflector system, e.g., 40 molybdenum/silicon pairs with layer thicknesses in the range of 7 nm. The mask blank is then patterned by means of a suitable method, e.g., electron beam scribing, in order to generate the photomask for the lithography process. During this patterning process, the reflecting surface of the EUV mask blank is provided with absorber structures as they are defined in the mask layout. The design on the mask is an enlarged image of the patterns in the microcircuit which is to be produced using a EUV mask of this kind.

However, the mask used for the EUVL process must be free from defects. Due to the fact that the features on the mask by which circuit patterns which are four times smaller are produced in the EUVL process are on the order of magnitude of a few tens of nanometers (e.g., up to 28 nm mask features for 7 nm patterns on the chip), particles or defects of the absorber structures on the active surface of the template of the photomask can cause defects of the absorber patterns which lead to a defective printing of the nano patterns and, therefore, to malfunctions of the microcircuit during exposure in the EUVL process. Such defects must be eliminated.

Consequently, it is necessary to examine the mask blanks for defects before patterning and to examine the finished photomask for defects after patterning in order to ensure that no defects were produced in the template area by this process and that the patterns are templated as intended. After finding such pattern defects on photomasks or mask blanks, it must be checked whether or not the defects found are critical for the patterns produced on the wafer, and a repair of critical defects and an inspection of the defects on the nanoscale are required.

In the field of the present invention, such defects on the mask are inspected with an actinic EUV microscope. The attribute "actinic" means that the object (photomask) is examined under original radiation conditions (in this case, EUV wavelength and bandwidth of the subsequent working wavelength). The angular resolution of the microscope should be greater than the typical pattern size of the photomask (target: 20 nm), and individual images should typically be capturable in less than 10 s with a certain flexibility with the illumination characteristics and optical imaging characteristics. For widespread deployment in the semiconductor industry and the supply chain thereof, a microscope of this kind must be operated autonomously in the widely dispersed EUV laboratories, which means that the EUV microscope is operated in connection with a compact EUV source and not a large synchrotron beamline laboratory. The only available sources with sufficient spectral brightness are the plasma emissions with a temperature of approximately 200,000 Kelvin which are generated by laser radiation or rapid high current gas discharges.

DESCRIPTION OF THE PRIOR ART

Measuring tools for which patents exist are available in the industry for the inspection of mask blanks and templates on a mask, i.e., for finding defects or imperfections in the mask patterns:

- For the actinic testing of mask blanks, there is the tool known as ABIT (Actinic Blank Inspection Tool) manufactured by the Japanese firm LASERTEC.
- For finding mistakes or defects on the mask, there are pattern inspection tools which normally still utilize optical radiation (>150 nm) and, as such, are "non-actinic".
- In order to check whether or not and how such features or defects are present in the mask print when used in EUV scanner lithography, the EUV-AIMS (Aerial Image Microscope System) by Zeiss is the tool of choice. The EUV-AIMS is deliberately not optimized for resolution, per se, but rather for emulating the imaging characteristics of lithography scanners. In this way, AIMS can quantify how a pattern is printed in the scanner and particularly whether or not a defect negatively impacts production or whether a defect has been successfully remedied.

Apart from the determination, i.e., the inspection, of deficiencies or imperfections, it is important to check the determined deficiencies. There are two steps in such checking of the lithographic quality of EUV masks:

1. evaluating the found defect candidates based on their relevance for the lithographic print process, and
2. eliminating found defects, if any. The process accordingly runs as follows:
   a. checking with an actinic tool adapted to the scanner resolution whether the defects determined during the inspection or the determined imperfection is actually printed as defect in the lithographic process.
   b. If a defect is detected as "reproduced", a repair is carried out by means of further steps.
   c. Before using the mask in the lithographic process, it is absolutely necessary to check whether or not the repair was successful, i.e., that no defects were printed at the location of the defect prior to the repair.

Beyond these tools, the defects and patterns must be viewed with high resolution in order to analyze the reasons for the defects and to better understand the nature of these defects. For many applications, in contrast to the AIMS inspection, a high-resolution examination is more important than the question of "printing". On the other hand, the AIMS inspection process has extremely high importance for the value chain of the lithographic process.

In contrast, a high-resolution inspection microscope which is scientifically or laboratory-relevant must be substantially less expensive and, beyond this, must be highly flexible particularly with respect to magnification, resolution and illumination.

The industry and its supply chain require a stand-alone mask image microscope which offers a high spatial resolution of almost 20 nm and a high flexibility with respect to spatial resolution and other optical imaging properties. Typical acceptable exposure times for individual images with this high resolution are in the range of 10 seconds to achieve "through-focusing series" of 10 to 20 individual images per spot and approximately 5 to 10 series per hour.

The following table shows available inspection devices and their characteristics:

|  | Flexibility (FZP) | Laboratory Source | Spectral Filter | Throughput |
|---|---|---|---|---|
| AIMS (Zeiss) | no: ML mirror | yes: Xe-GDP source | unnecessary | low |
| SHARP (CXRO) | yes | no: storage ring | monochromator | average |
| Perera U.S. Pat. No. 6,738,135 | yes | yes: Xe-GDP source | not mentioned | very low |

EUV-AIMS by Zeiss

A special stand-alone tool called "actinic aerial imaging microscope" (aAIMS) is listed and sold by Carl Zeiss SMT GmbH for the inspection process to check whether or not determined defects or pattern deficiencies actually impair the lithographic process and whether or not such printing errors were successfully repaired. The special feature of this microscope is that the printing performance of the lithographic scanner is emulated, i.e., the numerical aperture (NA) on the mask corresponds to the NA in the scanner. Reference is made to AIMS™ EUV.

In U.S. Pat. No. 6,894,837 B2, which is based on the priority of DE 103 19 269 A1, the use of Fresnel zone plates is rejected:

"U.S. Pat. Nos. 5,222,113; 5,311,565; 5,177,174 and EPO 459 833 show X-ray microscopes in which zone plates are provided in the projection optics for imaging . . . The disadvantage in using Fresnel zone plates in the imaging systems with a plurality of optical elements in the area of the X-ray radiation is that Fresnel zone plates are transmissive component parts which result in large light losses because of the poor transmission of X-ray radiation."

U.S. Pat. Nos. 6,469,827 and 5,022,064 describe the use of diffractive elements for the spectral selection of X-ray radiation through diffraction. However, in these two patents diffractive elements are used only for spectral separation and selection of X-ray radiation and not for correcting or improving the imaging characteristics.

The use of a diffractive element with refraction-enhancing and achromatizing effect for an objective, particularly a microscope objective, is described in DE-OS 101 30 212. However, an objective of this kind cannot be used for EUV radiation due to the low transmission of the optical elements. Because EUV radiation, in contrast to UV radiation, is very strongly absorbed in virtually all materials, the use of transmission-based optical components is pointless unless the optical path length is appreciably less than one micrometer.

U.S. Pat. No. 6,738,135 B1 discloses a system for inspecting lithography masks utilizing a laser source to generate a coherent electromagnetic radiation pulse in which the pulse is passed to a target which generates a plasma, the radiation emission thereof being collimated to form an extreme ultraviolet (EUV) beam. The EUV beam is directed through an aperture to define a cross-sectional area of the beam on a lithography mask. A transmission zone plate resolves the image reflected from the lithography mask and routes the image to a detector for analysis.

SHARP by CXRO
(https://sharp.lbl.gov/sharp/why-sharp/)

A similar tool for the early research in actinic circuit printing inspection was implemented by CXRO (Center for X-ray Optics, Berkeley, USA) and released under the name "SHARP". SHARP is an actinic extreme ultraviolet (EUV) microscope for photomask research. SHARP uses EUV radiation with a small angular divergence which is determined by a synchrotron storage ring with bending-magnet beamline. This spectrally broadband synchrotron radiation is filtered through a tunable monochromator to a small spectral bandwidth of $\lambda/\Delta\lambda > 1000$ at 13.5 nm. The beam is brought to the object, inter alia, spatially tuned. EUV passes a hole in a tiny membrane in the vicinity of the object in order to illuminate the surface of the mask in a small area.

Fresnel zone plate lenses image the EUV reflected from the object and produce a magnified image which is projected as highly magnified image in a diffraction-limited manner on an EUV-sensitive, back-illuminated CCD camera.

The zone plates are produced in patterned gold on a silicon nitride membrane by electron beam lithography. The lenses have a width of only approximately 100 μm comparable to the width of a single human hair. For the various lenses in SHARP, the focal lengths of the zone plates vary from 1.5 mm to 275 μm, that is, are very close to the mask surface but do not contact it.

SHARP is distinguished by the use of Fresnel zone plate optics and, consequently, by a high flexibility in the illumination process. Hundreds of zone plates which are selectable by the user are installed in SHARP: measurements can be carried out on the entire mask surface on empty photomasks (mask blanks) or on patterned photomasks with the SHARP mask table. With the option of switching between different zone plates, the nanoscopic imaging with magnifications of 100 to greater than 1000 on the mask surface makes possible a resolution of 22 nm in half-step (half-period) mode using a commercially available back-illuminated slow-scan CCD camera with pixels of 13.5 μm edge length. The frame capture time of SHARP is generally 5 to 8 seconds in the high-quality recording mode. When focusing with a step size of 0.4 µm or more, 11 to 21 steps are typically recorded by users so that SHARP can record approximately eight image series per hour depending on the test plan.

In general, the CXRO SHARP is the coarse model for a highly flexible mask imaging microscope as is required in the industry. However, since SHARP is inseparably bound to a synchrotron storage ring beamline (storage ring by Lawrence Berkeley National Lab), it is extremely difficult to implement as a stand-alone device in the form of a laboratory microscope.

U.S. Pat. No. 6,894,837 describes an imaging system for a microscope based on extreme ultraviolet radiation (EUV) using imaging reflective optics with a reflective-diffractive optical element, namely, an alternating-layer mirror objective (multilayer optics). As was described above, the disadvantage consists in the high costs and large dimensions of an individual objective, which makes it impossible to integrate different optics with different imaging characteristics.

Although the inspection process carried out with this system is fast in itself and the results can be determined in real time by fast algorithms, a detailed inspection of an entire full-size mask within a realistic time frame is not possible. Therefore, the EUV microscope can only be used for random sample inspection and requires an additional inspection tool to identify areas of interest on the photomask or good a priori knowledge about a region to be inspected.

X-Ray Microscopes

Microscopes with soft X-ray radiation in the water window spectral range (2.5 nm<λ<4.2 nm) were also implemented in the past for examining biological objects. However, because of their wavelength, these systems are not suitable for inspecting EUV masks in reflection mode. Reference is made to U.S. Pat. No. 5,177,774 A which describes a microscope of this kind for soft X-ray radiation.

EUV Sources (Plasma as EUV Emitter)

EUV radiation is formed when matter is heated to temperatures of 200,000 K, as a result of which the material evaporates and heats up to a plasma state. All elements brought to a plasma state are highly ionized (e.g., 12-fold to 14-fold for xenon) and—aside from IR, visible light, UV and VUV—also emit radiation in the EUV spectral region (often also called, more broadly, XUV region of 2 nm-20 nm). However, the emission spectra of these highly ionized elements are determined by their atomic energy level distribution—an invariant of every ion resulting from the individual nature of the element.

In EUV lithography with target wavelengths around 13.5 nm—promoted in a defined manner by the fact that a sophisticated technology for producing highly efficient alternating-layer mirror systems (multilayer mirrors) was available in this spectral region—three main candidates were identified early on, i.e., lithium, xenon and tin. Of these main candidates, lithium was rejected early on because it was found that broadband emitters such as xenon and tin achieve much higher conversion efficiencies into the typical spectral bandwidth for EUVL of 2 to 4% around the target wavelength of 13.5 nm. Later, tin was the target material used at the time because its emission spectrum has an emission peak at approximately 13.5 nm, which results in a higher spectral conversion efficiency that is accordingly workable for EUVL.

In principle, there are two possibilities for producing a EUV-emitting plasma of this kind: by irradiating the target material with an intensive laser beam or by means of electrical discharges with high current density.

Laser-Produced Plasmas

EUV-emitting plasma (laser-produced plasma [LPP]) is produced whenever intensive laser pulses are focused on a target surface with intensities of approximately $10^{11}$ W/cm². As a rule, an LPP prefers target materials which are solid or liquid in an ultra-high vacuum environment with a vapor pressure that is not too high. Since this is the case with tin and, moreover, it has a high conversion efficiency into EUV-workable photons, tin LPP is currently the preferred radiation source used in EUV scanners.

For metrological applications which do not react as sensitively to the conversion efficiency but which require an even broader-band continuous emission for spectroscopic examinations, gold-coated steel surfaces are preferred, for example.

Further, lithium LPP was also specifically explored because it produces an emission line at 13.5 nm that is chiefly of interest for EUV. However, since lithium LPP has a relatively low conversion efficiency which is not broad enough, e.g., for spectral applications due to the saturation of the radiation transport, lithium plasma is not used in practically any technical field. Further, because of a chemically aggressive nature which quickly leads to oxidation in contact with oxygen or water, lithium has strict requirements for handling.

Gas Discharge Sources

Alternatively, EUV radiation can be produced efficiently from high-current gas discharge spark plasma (discharge-produced plasma [DPP]). The typical threshold of EUV production is at a spark current of 15,000 to 25,000 A. A gas discharge EUV source is realized in the simplest manner when the discharge is ignited in a gas atmosphere of about 0.01 to 1 mbar of a gaseous target. Therefore, in the early days of EUVL, xenon DPP sources were studied and utilized for metrological applications and compact laboratory tools. Compared to DPP, LPP is distinguished by its brilliance, i.e., the emission efficiency per emitting surface of the source. On the other hand, DPP is simpler as regards the handling of the target material (in this case gas) and overall cost and can produce a higher EUV flow at the same input power on the power supply side. An overall efficiency of DPP of this kind with respect to the mains input power is higher compared to LPP, since a direct conversion of electricity into plasma excitation is used in DPP instead of the conversion of electricity into laser energy to plasma energy in LPP.

Hybrid Sources

As the EUV emission of tin (or of another solid target) was attempted in connection with the high efficiency of a DPP, this triggered the development of the hybrid solution of a "laser-assisted gas discharge plasma EUV source". In this schema, a laser generates vaporized tin which is then the atmosphere in which an electric gas discharge produces the DPP emission.

All of the known solutions have disadvantages when it comes to flexible independent tools for individual industrial laboratories and research and development laboratories with a high resolution of up to 10 nm and an acceptable throughput of more than, e.g., five frames per minute.

Zone Plate Versus Reflective Multilayer Coated Optics

In principle, both zone plate optics and multilayer optics allow a diffraction-limited resolution. There are only two variables for optical imaging which determine the resolution that is characterized by the minimum distinguishable feature size $\Delta x_{min}$:

Diffraction-limited resolution was discovered by Ernst Abbe as $\Delta x_{min} = \lambda/NA$, where
$\Delta x$ is the resolvable pattern,
$\lambda$ is the wavelength of the radiation that is utilized for the application (in this case, the EUVL wavelength of 13.5 nm), and
NA is the numerical aperture of the imaging optics.

For microscopes with condensers, this value was limited to the Rayleigh limit of $\Delta x_{min} = 0.61 \, \lambda/NA$ after a more thorough analysis.

For both types of lenses, the numerical aperture in microscopy corresponds approximately to the ratio of lens radius and focal length. However, for Fresnel zone plates it can be shown that the aperture is linked with the width of the outermost zone in such a way that it ultimately determines the Abbe resolution.

In order to obtain constructive interferences in the focus, the zones should alternate between opaque and transparent in radii (the following formulas are from http://zoneplate.lbl.gov/theory)

$$R_n = \sqrt{n\lambda f + \frac{1}{4} n^2 \lambda^2},$$

where n is the integer number as nth zone from the center, $\lambda$, is the wavelength of the light on which the zone plate is focused, and f is the distance of the center of the zone plate from the focus. If the zone plate is small in comparison with the focal length, this can be approximated as $$R_n = \sqrt{n\lambda f}.$$

As with all of the objectives, the diffracted, limited resolution is determined by the wavelength and the ratio between focal length and lens diameter ($\omega$), which is synonymous with the numerical aperture:

$$\omega = \frac{\lambda}{2NA}$$

For zone plates with many zones (N), the distance from the focus can be calculated when only the radius of the outermost zone $R_N$ and its width $\Delta R_N$ are known:

$$f = \frac{2R_N \Delta R_N}{\lambda}$$

For zone plates, it can be shown that the width of the outermost zone corresponds to the wavelength divided by two times the NA:

$$\Delta R_N = \frac{\lambda}{2NA}$$

When this equation is substituted into the resolution criterion, it can be shown that the maximum possible resolution of a zone plate in the large focus length limit depends on the smallest zone width $\Delta R_N$:

$$\frac{\Delta \lambda}{\lambda} \leq \frac{\lambda/(NA)^2}{f} \cdot \frac{1}{N}$$

Therefore, the smallest object that they can image, $\Delta x_{min}$, is limited in how small they can reliably make their zones.

Generally, Fresnel zone plates achieve a diffraction-limited resolution only with monochromatic radiation because the focal length is a function of the wavelength of the utilized radiation. Accordingly, the diffraction-limited resolution is achieved when this chromatic blurriness of the image is less than the resolution expected from the numerical aperture. Consequently, the acceptable bandwidth for a numerical aperture required for the resolution depends on the quantity of the focal length or on the quantity of zone rings, i.e., the diameter of the zone plate. This is clearly shown in the criterion for the spectral bandwidth given by the formulas for zone plates indicated above:

$$\frac{\Delta \lambda}{\lambda} \leq \frac{\lambda/(NA)^2}{f} \cdot \frac{1}{N}$$

which can be interpreted to mean that the narrower the bandwidth $\Delta\lambda/\lambda$ of the utilized radiation, the greater the focal length and also the greater the diameter of the zone plate ($R_N$), which goes along with an increase in the quantity of zone plates.

Consequently, the focal length and the field of view can increase as the bandwidth of the utilized radiation becomes narrower. The aim is certainly to maximize the focal length in the range of greater than 100 μm (because of the practical implementability) and a field of view on the order of magnitude of approximately 20 micrometers.

The magnitude of the ideal field of view is determined by the size of commercially available CCD detectors (27*27 mm$^2$), their pixel size of 13.5 μm and the consequent image magnification of approximately 1000×.

The properties of zone plates and multilayer mirror systems are compared in the following table.

|  | Zone Plates | Multilayer Mirror Systems |
| --- | --- | --- |
| best resolution $\Delta x_{min}$ | $\Delta x_{min} = c \, \lambda/NA \approx \Delta R_N$ | $\Delta x_{min} = c \, \lambda/NA$ |
| NA | affected by the width of the outermost zone | diameter of the optics relative to the focus length |
| focus length | for given $\Delta R_N$ and $\lambda$ only through quantity of rings | surface curvature |

-continued

|  | Zone Plates | Multilayer Mirror Systems |
| --- | --- | --- |
| diffraction-limited imaging | limited through chromatic errors | surface error and precision of mirror holder; better quality with multi-lens systems (N mirrors) |
| imaging efficiency | amplitude $\eta \approx 10\%$ phase: $\eta \approx 20\%$ | Mo/Si multilayer system: $\eta \approx (60\%)^N$ |
| cost per objective | approx. 1-10K € | several 100K € |

Beamline-Based Synchrotron Radiation Sources

The beamline installation at synchrotron storage rings or insertion devices generates synchrotron radiation with high spectral brilliance which, because of its high spectral brilliance, is ideally suited to achieve an efficient spatial and spectral filtering in order to achieve the resolution with an acceptable throughput. Accordingly, solutions such as SHARP offer an excellent spatial resolution and an extreme flexibility of optical characteristics which permit, e.g., changes in magnification or switching between conventional and phase-shifted zone plate optics. Therefore, a mask reflection microscope of this kind requires only a few seconds to capture an image and allows 10 to 20 through-focus sequences at approximately 10 points per hour.

In the SHARP installation, this is achieved through spectral filtering of the broadband synchrotron $\lambda/\Delta\lambda>1$ radiation to narrowband ($\lambda/\Delta\lambda>1000$) with a monochromator. An intensive narrowband beam of this kind makes it possible to use Fresnel zone plates for the microscope with workable lens at object distances and image field size as required above, while illumination and beam forming can be provided with broadband ($\lambda/\Delta\lambda<50$) reflecting multilayer mirrors.

Similar resolutions are achieved with reflecting optical systems, but these are extremely expensive and quite bulky due to nano thin film coating, alignment and stability because they require an extremely high precision of surface features.

Disadvantages and Problems of the Prior Art

Although synchrotron-based EUV microscopy may be better and more flexible, it can only be implemented as radiation source in decentralized large-scale installations and research facilities.

Working distance and field of view depend decisively on the bandwidth of the utilized radiation.

When aiming for a resolution of 20 μm with a xenon source or tin source with a multilayer filtered bandwidth of 2%—which is always the most efficient and economical solution—the working distance would have to be in the range of 6 μm, which is rather elaborate for the control and stability of the focus. The field of view would have a diameter of under 100 nm.

If the bandwidth is filtered to 0.2%, e.g., with commercially available EUV gratings (e.g., by Hitachi) or special multilayer coated filters, the following specific disadvantages result:

at least one order of magnitude of the 2-% bandwidth flow of xenon or tin is lost;

the spectral filtering requires special components and has, at best, an efficiency of 15%;

the working distance is increased to approximately 60 μm—still relatively small;

the field of view would have a diameter of approximately 700 nm.

The filtering of the broadband xenon emission or tin emission to $\lambda/\Delta\lambda=1500$ (very similar to values used in SHARP) of the relative bandwidth would:

allow the use of a working distance on the order of 175 μm and a field of view in the range of 20 μm to be achieved, but would lead to a drop in spectral conversion efficiency to approximately 3% with an estimated filter loss of 85% so that the radiation flow would make up approximately 0.6% of the total 2-% bandwidth in a EUV scanner.

It is the object of the invention to inspect defects and patterns on photomasks for extreme ultraviolet lithography (EUVL) with high spatial resolution in the range of <50 nm flexibly, efficiently and quickly with a compact laboratory source.

This object is met according to the features of claim 1. Advantageous embodiments are described in the subordinate claims.

According to the invention, the above-stated technical problem is solved in that a compact, stand-alone ("laboratory-capable") EUV radiation source is utilized which emits IR and EUV radiation with its natural spectral distribution and an optical system with, e.g., optical multilayer optics for irradiation of the object and Fresnel zone plates (FZPs) for generating high-resolution images (<100 nm resolution). Since these FZPs are highly achromatic with respect to their imaging, the utilized radiation must be very spectrally narrowband.

By "narrowband" is meant that the spectral bandwidth ($\Delta\lambda$) of the radiation in the beam is smaller than the wavelength divided by a factor $N_{bw}$ which is greater than 500, preferably equal to or greater than 1000. Therefore, the bandwidth of such beams is often referred to as $\lambda/\Delta\lambda<N_{bw}$.

Since all compact "laboratory-capable" EUV radiation sources emit broadband spectra generally from a minimum wavelength (approximately 5 nm for EUV sources) into deep infrared, some means must be employed for filtering the spectral emission distribution ($\lambda/\Delta\lambda>N_{bw}$) in the narrowband EUV beam with the wavelength of interest $\lambda_{CWL}$. In EUV masks for lithography, this wavelength generally amounts to $\lambda_{CWL}=\lambda_{EUVL}\approx(13.5\pm0.2)$ nm depending on the design of the lithographic scanner.

This narrowband EUV beam is directed focused onto the object which is to be measured as EUV photomask in reflective geometry. The EUV radiation reflected from the object is magnified by Fresnel zone plate-type objectives to generate an image which is captured by a two-dimensional image detector which is sensitive to EUV radiation.

According to the invention, it is suggested to use a line emission with high brightness of elements with a low atomic number Z which inherently already emit narrowband line radiation ($\lambda/\Delta\lambda>1500$). When this is combined (e.g., by multilayer mirror reflection) with a filter with low bandwidth (bandwidth filter: $\lambda/\Delta\lambda<50$), a suitable spectral narrowband distribution is achieved with a small expenditure on filters.

In general, the spectra which are produced from elements with low atomic numbers Z, e.g., He, Li, B, Be, . . . up to, for example, argon (Z=18), usually contain distinctly separate, i.e., freestanding, emission lines. Preferably, elements with atomic numbers Z<10 are selected, elements with atomic numbers of Z=2 . . . 8 being particularly preferred because the freestanding emission lines in these cases additionally have a greater distance, which substantially facilitates spectral filtering.

Emission spectra of elements with high atomic numbers (e.g., gold or lead) emit a plurality of individual lines lying close to one another and overlapping so much that a virtually continuous spectrum occurs over a very broad spectral band (e.g., 8 nm-20 nm), which requires a considerable expenditure on narrowband filtering.

Lithium LPP was specifically investigated because, for EUV, it chiefly generates a dominant emission line at 13.5 nm which has a spectral bandwidth of $\Delta\lambda\leq0.009$ nm, which corresponds to a relative bandwidth of $\lambda/\Delta\lambda=1500$, and is accordingly best suited for a narrow bandwidth comparable to SHARP. An approach of this kind could achieve a targeted throughput of less than 5 seconds per frame with a quite compact laboratory source if it is generated by the laser-produced plasma concept which is distinguished by high brightness in general.

This approach is substantially simpler and more efficient (by more than an order of magnitude) than the prior art which filters the emission of a high-power laboratory source (e.g., based on tin or xenon) in a quasi-broadband manner ($\lambda/\Delta\lambda<10$) to the narrow bandwidth through the use of gratings, e.g., in monochromators. This concept is certainly very successful when synchrotron radiation sources are utilized through beamlines or insertion devices with high spectral brightness (more accurately, brilliance, i.e., output per area unit and solid angle) but are not suitable for operating a stand-alone measuring tool required by the semiconductor industry for the EUVL supply chain.

The present invention provides a novel and useful system for flexible high-resolution inspection of patterns and defects on EUV lithography photomasks by which defects and patterns on photomasks for extreme ultraviolet lithography (EUVL) can be inspected flexibly, efficiently and quickly (i.e., with high throughput) at a high spatial resolution in the range of <50 nm with a compact plasma-based "laboratory-capable" EUV radiation source.

BRIEF DESCRIPTION OF THE DRAWINGS

The invention will be described more fully in the following referring to embodiment examples. The drawings show.

DETAILED DESCRIPTION OF THE DRAWINGS

Figure 1:
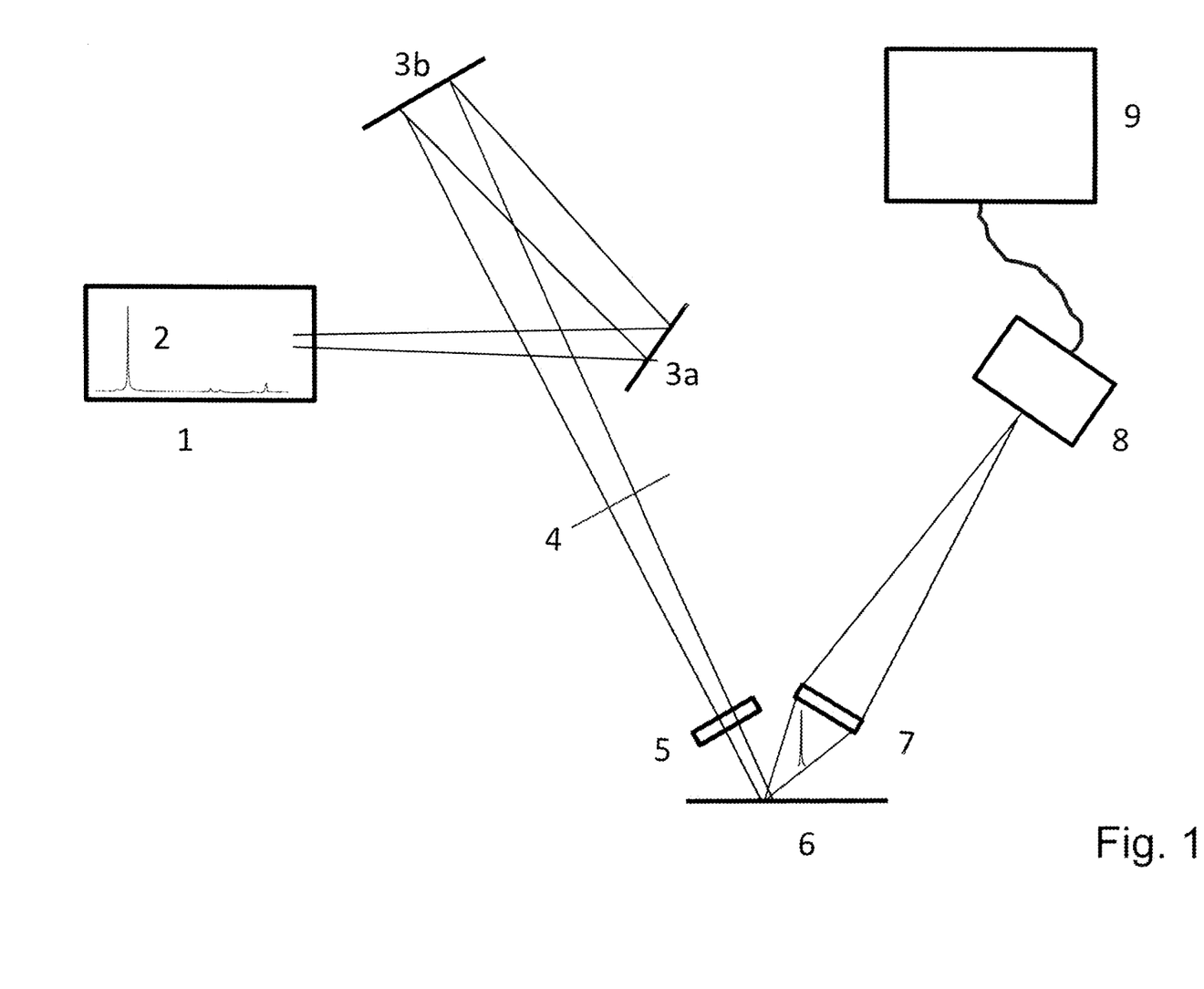
FIG. 1 a schematic view of the system of the present invention.

FIG. 1 shows the diagram of a possible construction of the invention. A compact plasma-based EUV source 1 emits EUV radiation in the spectral range of, e.g., 12 nm-20 nm with high intensity and brilliance accompanied by longer-wave radiation components (in the IR, VIS, UV range). The spectral emission 2 of this EUV source 1 is chiefly concentrated on an intensive freestanding emission line close to the EUVL working wavelength of 13.5 nm. This emission 2 of the EUV source 1 is guided to the object 6 via one or more optical elements 3a, 3b, . . . coated with multilayer filters. It is essential that a spectral purity metallic thin-film filter 4 is arranged at any location in this beam path up to the object 6 as spectral bandpass filter (SPF=spectral purity filter) which blocks the long-wave radiation. Illumination characteristics and imaging characteristics can be assisted through additional optical elements (not shown) in the beam path. Examples include reflection mirrors with grazing light incidence or a condenser mirror.

The radiation is then reflected from the object surface 6 and—since it now contains essentially only narrowband EUV radiation around 13.5 nm—can be imaged with high resolution with a zone plate 7 having a diameter of $>1$ µm, preferably $>20$ µm.

The distances of the zone plate 7 from object 6 are selected such that a magnified image of the surface of the object 6 is projected on the two-dimensional EUV detector array 8 (e.g., a back-illuminated CCD, CMOS camera, etc.). The signals generated in the detector array 8 are transmitted electronically to a computer 9 which permits an image display and carries out a further image processing.

The requirement for flexibility of the optical imaging beam path is also met through the use of the Fresnel zone plate objective in the EUV inspection microscope. The only alternative solution that would be usable for the high-resolution imaging of EUV radiation at approximately 13.5 nm is mirror optics with at least two (Schwarzschild objective) mirror substrates which are coated with multilayer reflection filters (e.g., alternating silicon and molybdenum layers). However, for a high resolution, such mirror systems require the production of extremely precise substrates with low roughness and a precise coating of layer pairs with a thickness of more than 30 nm, typically 7 nm, with a thickness accuracy higher than 0.05 nm. Beyond this, the layers must be produced with a thickness gradient over the mirrors for high apertures.

The required implementation of a plurality of such objectives in a microscope, which would then be very costly and rather bulky, can only be avoided through the invention by using Fresnel zone plates 7.

With the Fresnel zone plate objectives 7, the achievable resolution $\Delta x_{min}$ depends directly on the width of the outermost zone $\Delta R_N$. As is shown in FIG. 6, less than 20 nm were proven and are available.

The Fresnel zone plate 7 can be produced by simple nano electron beam scribing of the required patterns and by nano-precise etching of the absorber or phase shift patterns. A simple zone plate 7 is sufficient for high-resolution imaging. Since an individual zone plate 7 generally has a diameter of less than 1 mm and a height of less than 1 μm, it is simple to provide many of them in the same tool with an implemented exchange mechanism. A multiple zone plate system of this kind has already been realized.

Figure 6:
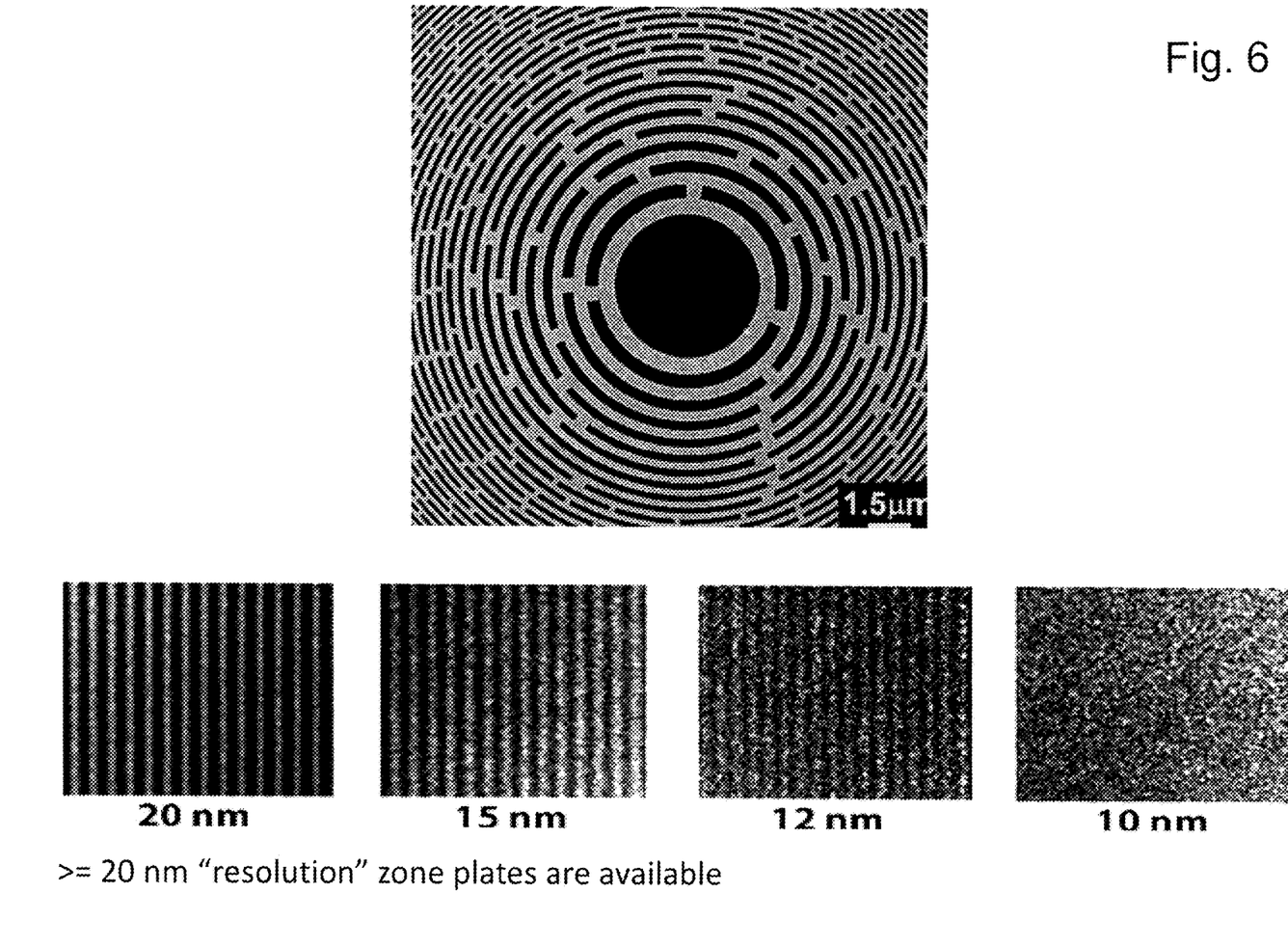
FIG. 6 example of a zone plate with 1.5 µm diameter produced by a CXRO nanoscribe group showing next to it patterns from 20 nm to 10 nm.

FIG. 6 shows an example for the zone plate 7 used in the system according to the invention. The zone plate is produced with a diameter of 1.5 μm by means of a CXRO nano scribe group. The stripe pattern images illustrated next to it show that perfect patterns are achieved up to 20 nm, patterns are still clearly perceptible at 15 nm and 12 nm but have a low contrast and that the limit of pattern recognition first occurs at 10 nm.

Figure 7:
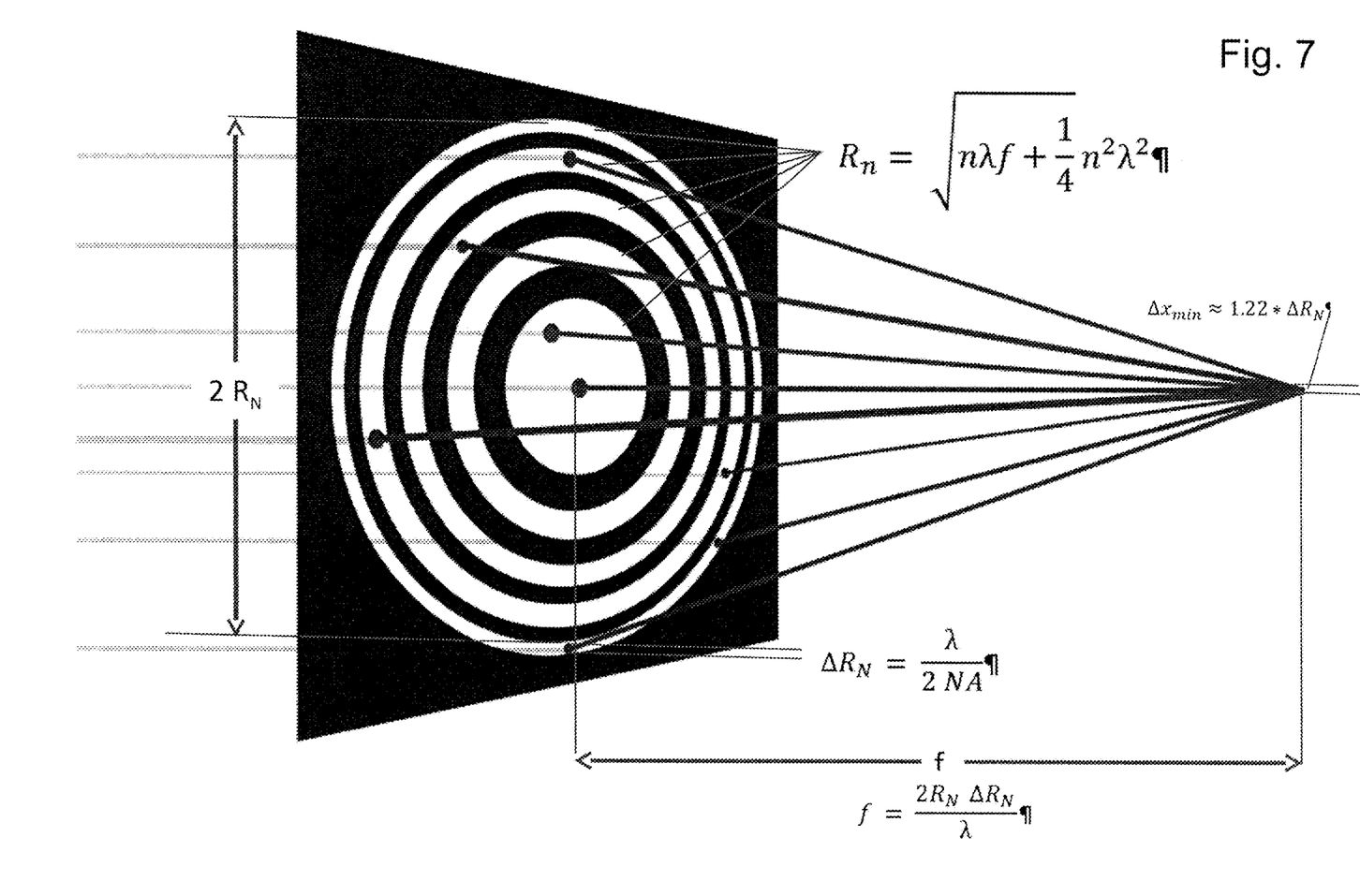
FIG. 7 diagram showing a Fresnel zone plate which focuses a planar wave.

FIG. 7 shows a specific schema of a Fresnel zone plate 7 which focuses a planar wave. Due to chromatic errors, the theoretical resolution determined by the width of the outermost zone $\Delta R_N$ can only be obtained when the bandwidth of the radiation which amounts to $(\lambda/\Delta\lambda)$ is less than the quantity N of zones $R_N$ in question.

Application of Narrowband Radiation for Imaging for a Diffraction-Limited Image

Since the Fresnel zone plate optics 7 are very susceptible to chromatic errors, i.e., since they have different focal lengths f for different wavelengths λ, the best ("diffraction-limited") resolution is achieved only when the bandwidth of the wavelengths used for the imaging process, expressed as $(\lambda/\Delta\lambda)$, is less than the quantity N of zones $R_N$ in the zone plate 7. As a result, the condition $(\lambda/\Delta\lambda) \leq N$ must be met.

In order to achieve the best possible solution to the object of the invention, the light used for imaging should be narrowband, preferably better than $\lambda/\Delta\lambda=1000$; preferably $\lambda/\Delta\lambda=1500-2000$.

For practical reasons, it is important to have a focal length which defines the working distance between the object and the lens. The focal length must be large enough to achieve an accuracy of approximately 1% for the best image resolution and an image field which amounts to approximately one half of the diameter $D_N$ of the zone plate 7 so that usable images with a high resolution over a commensurate area of the object 6 are achieved.

If only a bandwidth of $\lambda/\Delta\lambda=500$ is accepted in these considerations, the focal length in this example amounts to less than 50 μm and the image field diameter is approximately 20 μm. These values are very small for fulfilling the further technical tasks but lie within the realm of feasibility. Even greater bandwidths of, e.g., $\lambda/\Delta\lambda=50$ such as are used in the lithographic scanning process give a focal length of f=6 μm and image fields of 2 μm on the object and would therefore not be practicable or usable as a solution to the above-stated problem. Consequently, only a solution of narrowband radiation of $\lambda/\Delta\lambda>500$, preferably>1000, is suitable for high-resolution imaging.

The plasma-based EUV source 1 is the precondition for a stand-alone inspection tool such as the microscope system according to the invention for inspecting patterns and defects on EUV photomasks as object 6.

Only LPP or DPP (Discharge Produced Plasma) laser sources are contemplated as plasma-based EUV sources for stand-alone EUV microscopes and, due to their compactness, are the preferred means for stand-alone "laboratory-capable" EUV technology installations.

Laser-produced and discharge-produced sources (LPP and DPP sources) which use tin or xenon as emitter elements for the EUV and which have been used since about the year 2000 in the EUV lithography process and also for "actinic" qualification metrology are converted by the invention to emitter elements with low atomic numbers Z<20 (preferably Z≤10 and particularly 2≤Z≤8) which have the characteristic property of dominant freestanding emission lines and accordingly facilitate spectral filtering and make possible optical high-resolution image capture by means of Fresnel zone plate objective 7 in the EUV range corresponding to the working wavelength of the EUV lithography scanner.

Taking into account the fundamentals of zone plate imaging, a spectral filtering of the emission is indispensable. Although emitter elements which preferably generate narrowband line radiation appreciably reduce expenditure on spectral filtering, it is still always necessary, in addition, to suppress non-EUV emissions from the vacuum ultraviolet, ultraviolet, visible to infrared spectral regions to a narrow EUV bandwidth for the required high resolution. Thin metal transmission filter films are used as means for suppressing non-EUV emissions. The metal films or metal-coated films which reflect UV, VIS and IR radiation and absorb VUV radiation are preferred. However, for an acceptable EUV transmission of at least a small percentage, the thickness of such films must be below 1 μm. Typically, e.g., 200-nm zirconium or niobium films are used. However, diffraction on a grating with a choice of required wavelength would also be possible.

The reflection of EUV on a mirror coated with multilayer filters such as is also used in lithographic and AIMS mirror systems can be used for broadband filtering when they are sufficiently selected to have a bandwidth of $\lambda/\Delta\lambda=N$, where N represents the quantity of layer pairs.

Since multilayer mirrors 3a, 3b are used in any case to focus the EUV beam on the object 6, these "deflecting or condensing optical elements" can be constructed in such a way that they can bring about a "focusing" as well as a spectral filtering. Such "multilayer filters" (alternating layer systems) can also be formed as reflective layers on thin transmission windows, for example, of the type utilized for suppressing the above-described non-EUV emission. Beyond this, monochromators such as are known from the visible region and X-ray region, could also be used in principle so as to be optimized for EUV radiation.

The core idea of the microscope system according to the invention is the selection of the emitter material for generating the EUV-emitting plasma. "Low-Z" emitter elements with narrowband freestanding emission lines are chosen from the periodic table of elements so that they "meet" the center wavelength of the desired narrowband EUV beam as well as possible. This core of the present invention is based on firsthand experimental experiences that a EUV radiation source 1 can be designed and optimized such that it only emits some freestanding or isolated intensive emission lines in the EUV spectral region. As has been determined from firsthand experiments, such emission lines have a bandwidth of $\lambda/\Delta\lambda>1500$. However, the characteristic of a freestanding emission line, i.e., of a dominant, intensive and well-separated emission line, is only available with elements of the periodic table having low atomic numbers Z (for short, "low-Z" elements) from lithium (Z=3), carbon (Z=6), nitrogen (Z=7), oxygen (Z=8), fluorine (Z=9) to neon (Z=10).

In consideration of the narrow spectral bandwidth of interest, such elements deliver "plasma resonance lines" with a much higher photon flux and a much higher spectral brightness (brilliance) compared to the excitation of broadband emitters with the same amount of input energy.

By optimizing the excitation parameters (discharge voltage and pulse energy with DPP; pulse length, intensity, point size with LPP) to the respective "low-Z" emitter element, the generated emission lines are separated by $\Delta\lambda > \lambda/50 = 0.27$ nm and are considered to be isolated or freestanding. With an "isolated line emitter source" of this kind, a broadband filtering can easily be achieved through multilayer reflections with a much higher efficiency than with any monochromator solution.

For the microscope, there is a specific way to obtain a radiation of $\lambda/\Delta\lambda > 1000$ in which an element which emits a narrowband isolated line radiation close to the targeted working wavelength of 13.5 nm is used. Another broadband emission beyond this one emission line can be filtered in a simple manner in that some multilayer alternating layer mirrors are provided in the beam path which roughly filter the light with approximately 60% reflectivity to approximately $\lambda/\Delta\lambda < 50$. Outside of the IR bands, VIS and UV are only blocked by a spectral thin-film filter window. Basically, all elements from helium to neon have some of these freestanding narrowband lines, but only a few in the spectral region of 12-16 nm of interest for EUV technology. However, the other elements can make it possible to transfer this technique to other application wavelengths of interest in the XUV and VUV spectral range.

Lithium as Preferred Emitter Element

Lithium as emitter element is characterized in that it emits its strongest emission line at precisely 13.5 nm so that lithium is of particular interest for applications in the domain of EUVL. As was described above, lithium is seldom used as EUV emitter element because it has a conversion efficiency into the 2% bandwidth useful for EUVL of approximately 1% compared to values with xenon (3%) or tin (up to 6%).

However, a filtering to $\lambda/\Delta\lambda = 1500$ through multilayer reflections at an interference filter system with an overall efficiency of 30% in the worst case (to be applied for every solution in every case) would have no spectral losses, since the emission line has this narrow bandwidth inherently.

Figure 3:
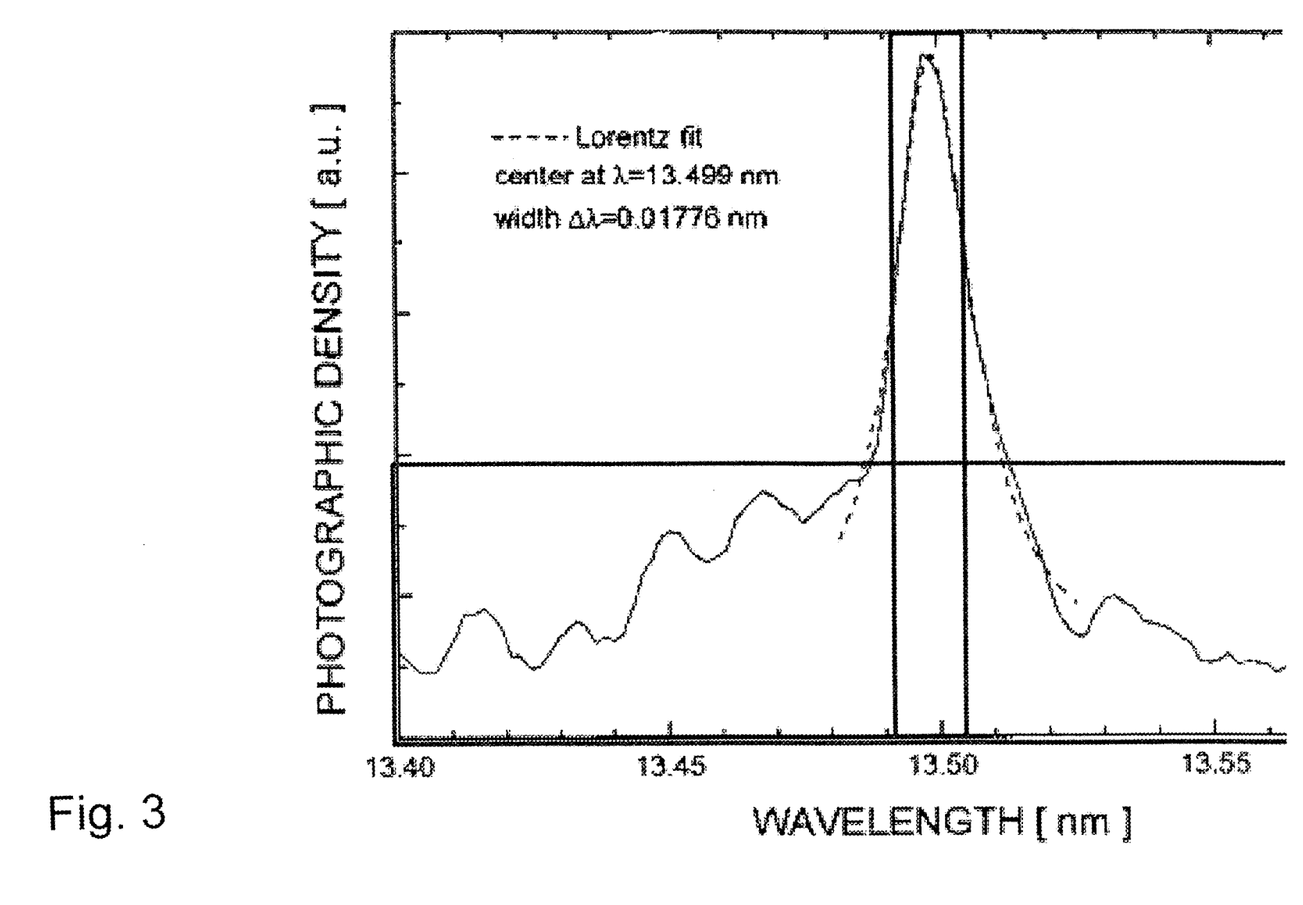
FIG. 3 the Lyman-alpha ($Ly_\alpha$) emission line at 13.5 nm resolved with a second order spectrograph of $\lambda/\Delta\lambda<700$.

FIG. 3 shows the Lyman-alpha ($Ly_\alpha$) emission line at 13.5 nm resolved with a second order spectrograph of $\lambda/\Delta\lambda < 700$. The diagram shows a bandwidth of this emission line of $\lambda/\Delta\lambda > 1400$ which is already almost perfect for high-resolution imaging, while the measured bandwidth is still always considered limited by the resolution of the spectrograph.

In summary, it may be said that a lithium source with a target bandwidth of $\lambda/\Delta\lambda = 1500$ would achieve a total efficiency of 0.3%, while the efficiency as a result of filtering with xenon would drop to 0.02% and with tin to 0.03%. Therefore, a lithium source with the same input power is at least 10 times faster than a tin source and more than 20 times faster than a xenon source with respect to throughput.

Example of a Preferred Embodiment Form

Various aspects of the present invention will be apparent from the following detailed description of the preferred embodiment forms of the invention referring to the drawings mentioned above.

Figure 4:
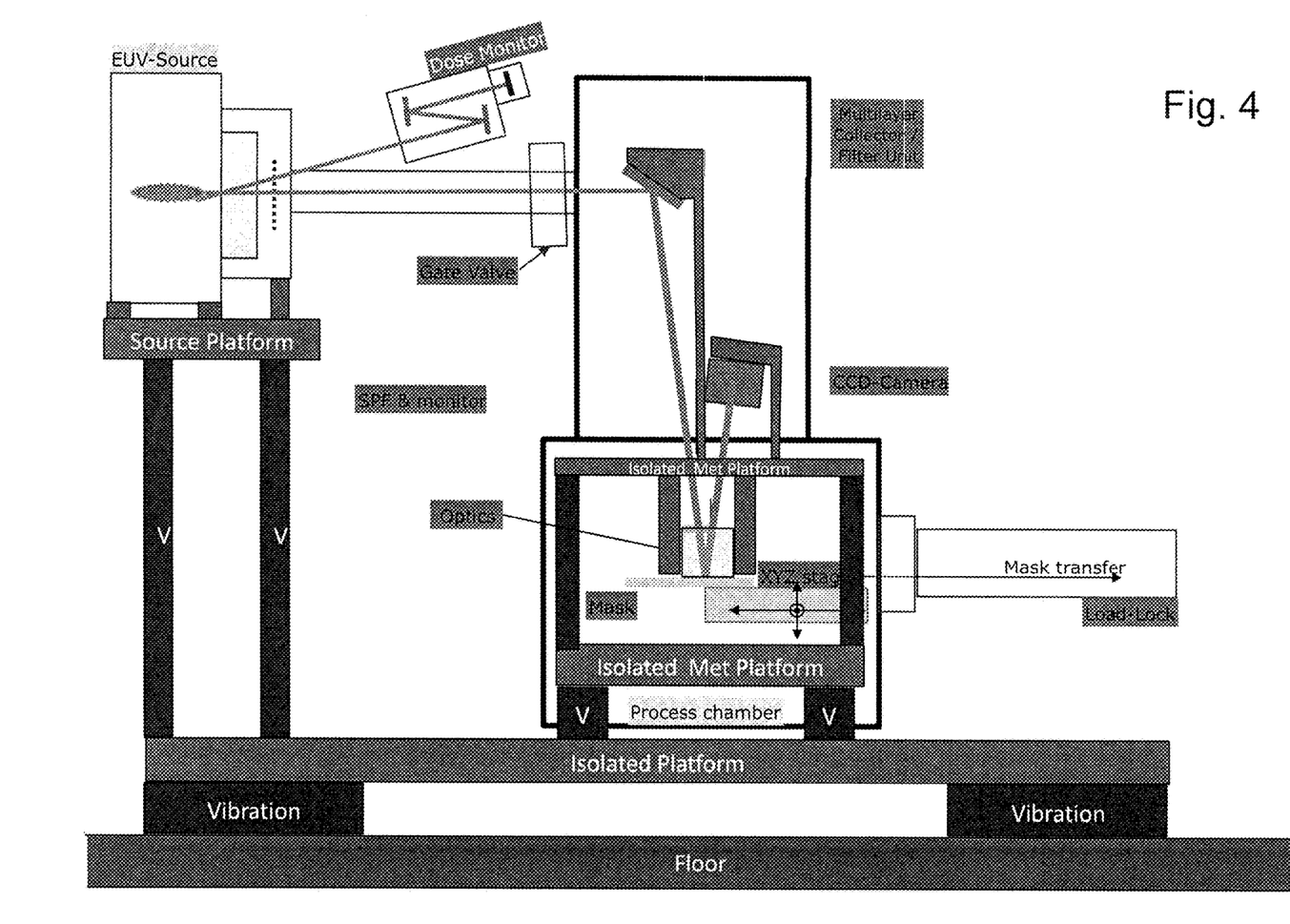
FIG. 4 schema for a complete EUV reflection microscope using the proposed invention.
Figure 5:
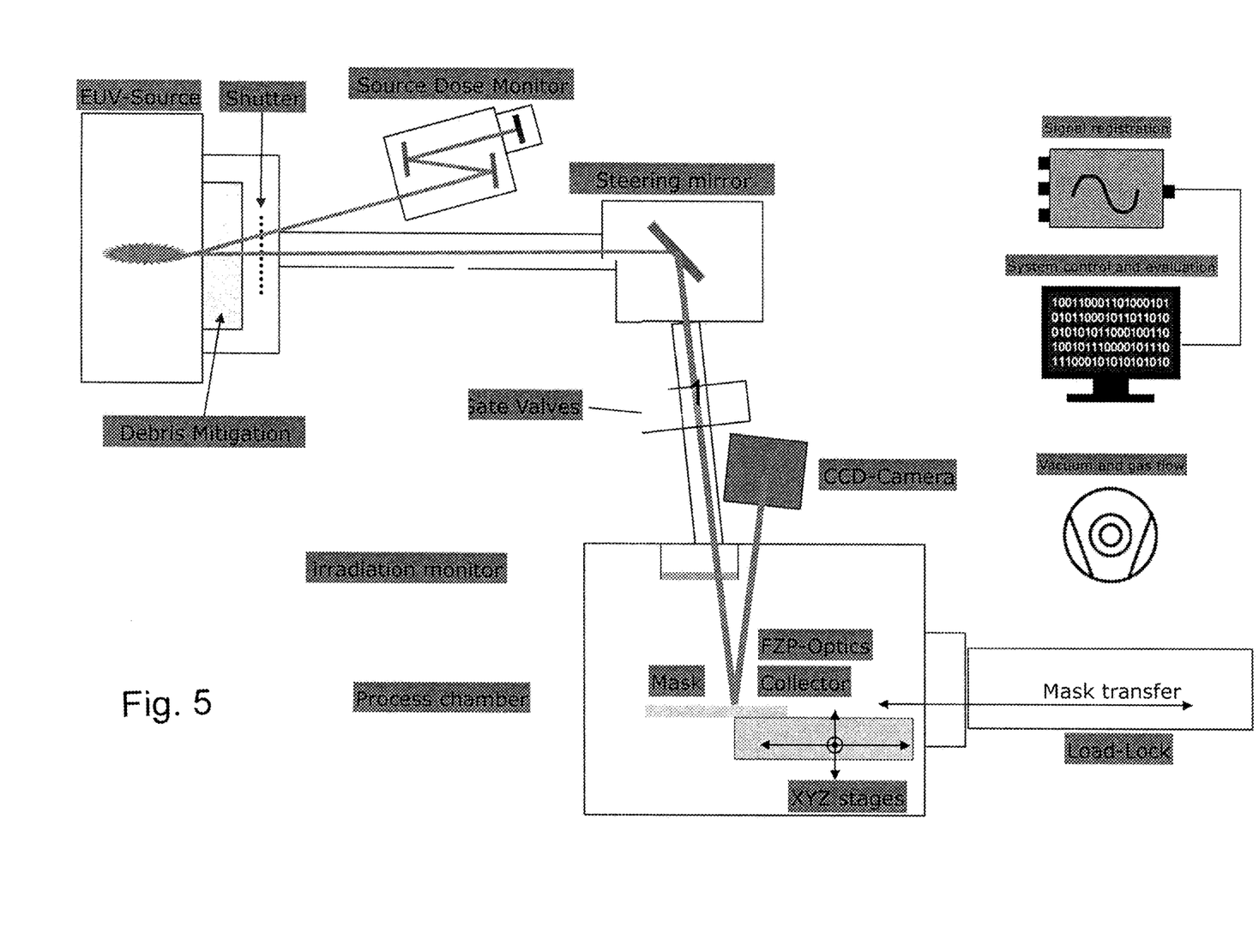
FIG. 5 basic schema of a EUV reflection microscope using the compact EUV radiation source according to the invention with a plasma source, the emitter element of the EUV reflection microscope has a dominant freestanding emission line and therefore permits the use of a Fresnel zone plate objective in the EUV microscope with simple filter means of multilayer filter mirrors and a bandpass (SPF)

Preferred embodiment forms of the present invention are shown in FIG. 1, FIG. 4 and FIG. 5.

A compact plasma-based EUV radiation source 1 emits—among other wavelengths (IR, VIS, UV)—especially EUV radiation in the spectral range of 12 nm-20 nm with high brightness. The plasma emission (DPP or LPP) is thermal (i.e., isotropic and non-coherent electromagnetic radiation pulses). Such radiation sources are generally available.

Figure 2:
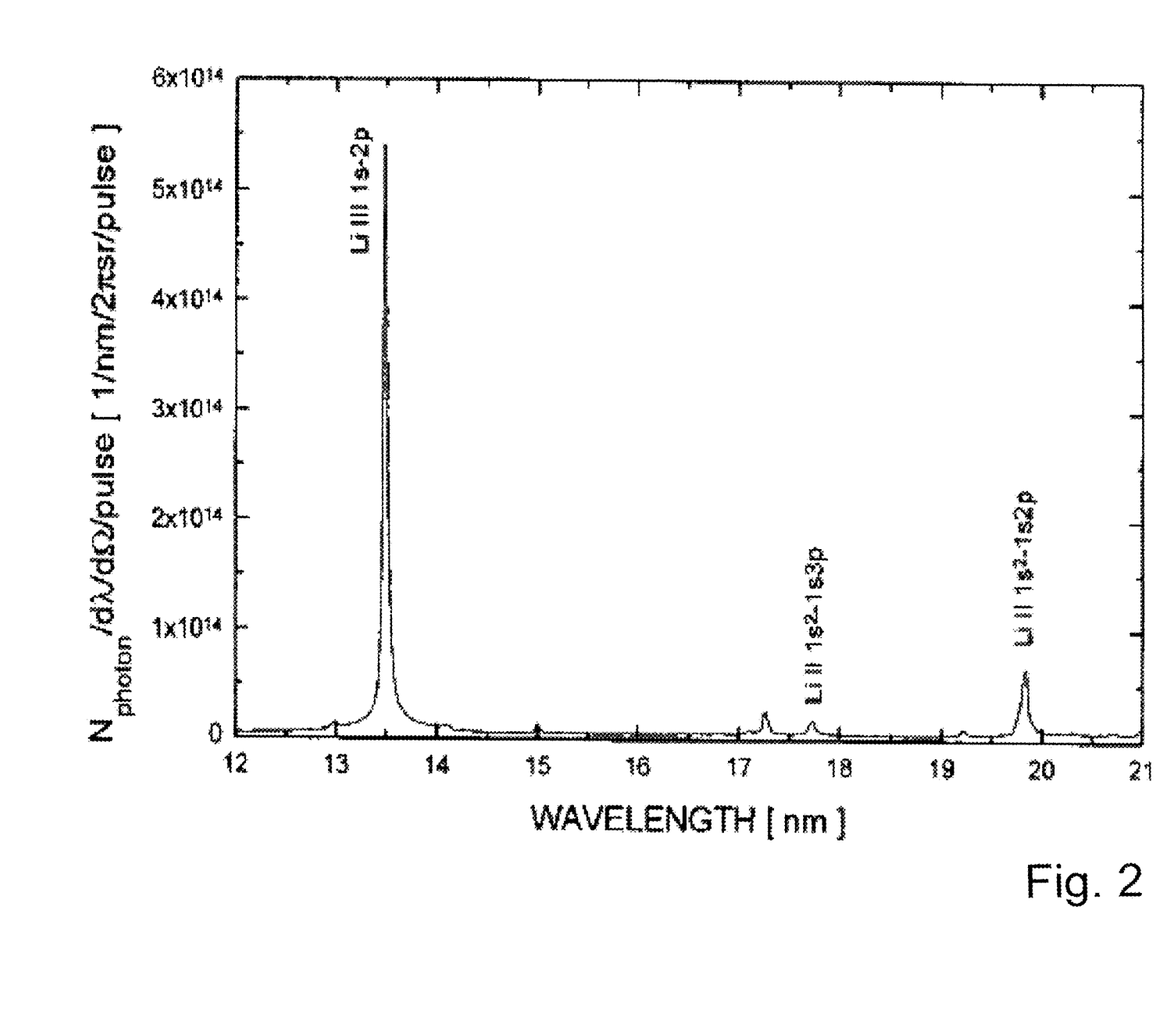
FIG. 2 the emission of a plasma line emitter with isolated emission lines which are used for the invention for lithium as example.
Figure 8:
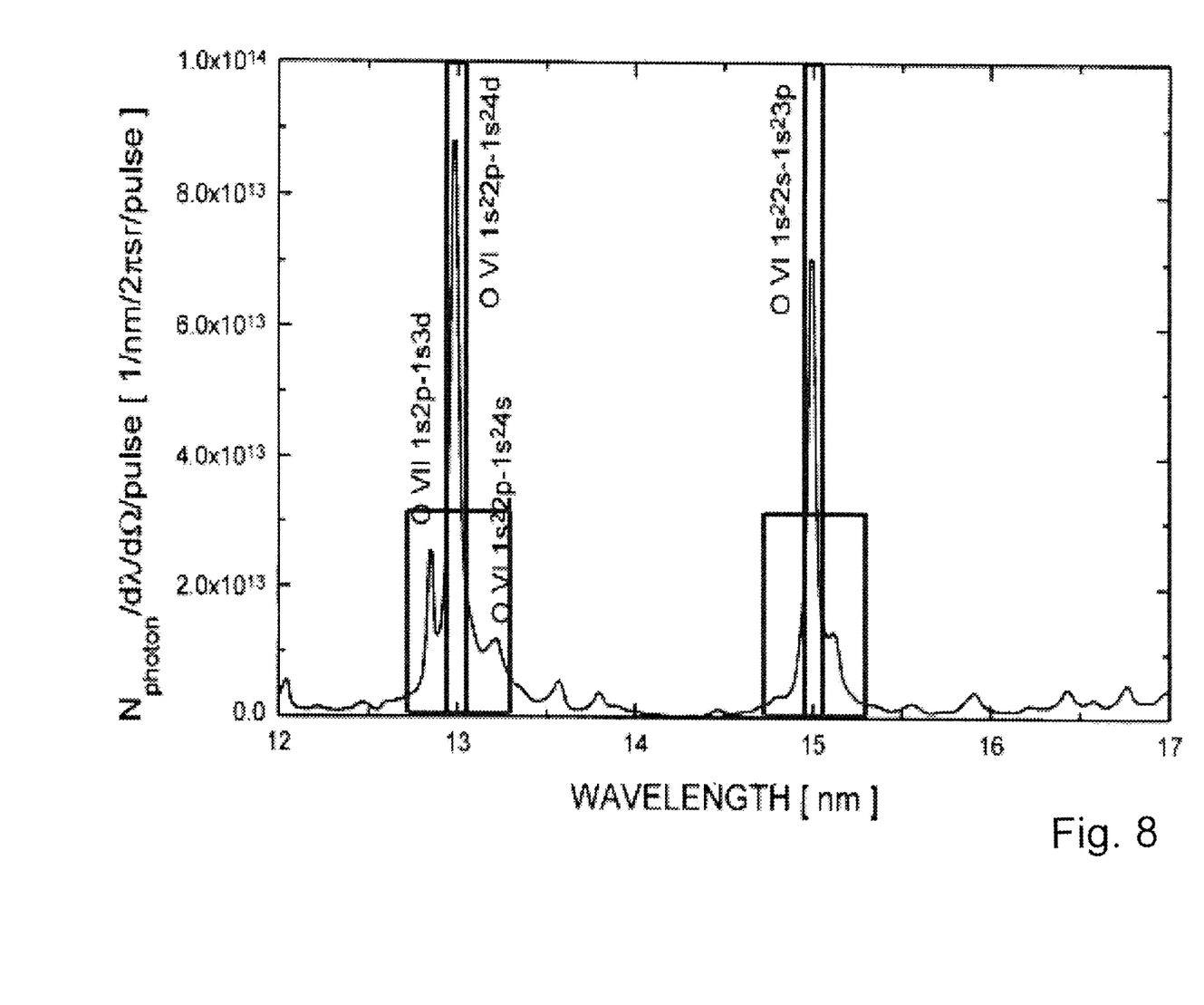
FIG. 8 EUV emission spectrum of oxygen with two freestanding emission lines.

The spectral emission 2 of the EUV radiation source 1 utilized in this case is principally adjusted to an intensive freestanding emission line (see FIGS. 2 and 3) close to the EUVL wavelength of 13.5 nm in that an element with a low Z value (atomic number in the periodic table of elements) is selected as emitter material which emits narrowband freestanding emission lines in the spectral range between 13 nm and 15 nm (see, e.g., the emission spectrum of oxygen in FIG. 8).

An ideal emitter element with these properties for the current EUV working wavelength is lithium with a strong, narrow-band, freestanding line at 13.5 nm which is adopted as emitter in the present case without limiting generality. The emitting plasma as source volume and a volume in which objects 6 (EUV photomasks) are examined are separated by at least one thin-film filter window 4 (with a typical thickness of 50-500 nm) which is preferably metal or coated with a metal (e.g., with zirconium or nickel) in order to reflect and block long-wave radiation (IR, VIS, UV) and to absorb VUV radiation. This filter window 4 can be located on the way to the object 6 (photomask) at any point in the beam path.

The emission 2 of the radiation source 1 is guided via at least one multilayer coated optical element 3a and 3b either directly to the object 6 or to a condenser 5 which—again as multilayer coated optical element—guides a beam to the object 6. Illumination characteristics and imaging characteristics can be reinforced through additional optical elements in the beam path. Examples are reflection mirrors with grazing beam incidence or a condenser mirror.

The combination of narrowband lithium emission, broadband EUV filtering through the multilayer reflections and metal filter windows 4 ensures that only radiation of the desired center wavelength $\lambda$ and bandwidth ($\lambda/\Delta\lambda$) impinges on the object 6.

This radiation is then reflected from the surface of the object 6 and can be imaged with high resolution and efficiency with a zone plate 7 having a diameter of $>1$ µm because it contains substantially only narrowband EUV close to 13.5 nm. The distances from the zone plate 7 to the object 6 are dimensioned such that a magnified image of the object 6 is imaged on the surface of detector 8.

This allows a 1000× increase in the spatial reflectance variations from the object 6 through the use of a Fresnel zone plate objective so that the magnified image with a resolution of up to 20 nm with a EUV-sensitive detector array (e.g., back-illuminated CCD, CMOS camera, etc.) although such cameras have pixels of typically 13.5 µm square. The signal generated in the detector 8 is electronically transmitted to a computer 9 for evaluation of the recorded patterns, which computer 9 enables the display and further image processing.

Relying on the basic schema from FIG. 1, FIG. 4 shows an advantageously constructed schema of a complete EUV reflection microscope using the proposed invention, where merely the reflection at two surfaces 3a, 3b coated with multilayer mirrors and a metal film filter suffice as spectral filter arrangement, since the EUV source 1 has a suitable intensive freestanding emission line. The object 6 usually adds a further spectrally filtering reflection as filter, which further improves the function of the high-resolution imaging of the Fresnel zone plate 7. Accordingly, a Fresnel zone plate 7 which—as is shown in FIG. 6—generates an excellent imaging of the surface patterns of the object 6 onto the EUV detector array 8 can be used as microscope objective.

FIG. 5 shows a further basic schema for a EUV reflection microscope using the compact EUV radiation source 1 according to the invention with a plasma source comprising an emitter element which has a dominant freestanding emission line and therefore allows the use of a Fresnel zone plate objective in the EUV microscope with simple filter means comprising multilayer filter mirrors and a bandpass (SPF).

The invention claimed is:

1. A microscope system for inspecting patterns and defects on EUV lithography photomasks, comprising:
    a stand-alone plasma-based EUV radiation source with an emission spectrum containing at least one dominant freestanding narrowband line emission in the spectral range from 12.5 to 14.5 nm, wherein the narrowband line emission has a relative bandwidth of $\lambda/\Delta\lambda > 1.000$,
    a filter for broadband spectral filtering $\lambda/\Delta\lambda < 50$ for selecting the dominant freestanding emission line from the emission spectrum of the spectral range,
    a filter for suppressing radiation with wavelengths which are located outside of the EUV spectral region and are at least longer than 20 nm,
    an illumination source for illuminating a patterned object which reflects the narrowband line radiation,
    zone plate optics for magnified imaging of the object and a resolution which corresponds to the width of an outermost zone of the zone plate of at least 100 nm and has a numerical aperture corresponding to more than 1000 zones, and
    an EUV-sensitive two-dimensional detector array for capturing the magnified imaging of the patterned object.

2. The system according to claim 1, wherein the EUV radiation source is a plasma-based source which is generated by a laser beam focused on a target.

3. The system according to claim 1, wherein the EUV radiation source is a plasma-based source which is generated by an electric gas discharge.

4. The system according to claim 1, wherein the EUV radiation source is generated through resonant line emission of an emitter element with a low atomic number $Z<20$.

5. The system according to claim 1, wherein the EUV radiation source is produced through isolated narrowband resonant line emission using at least one of the emitter elements including lithium, carbon, nitrogen, oxygen, fluorine, neon and argon.

6. The system according to claim 1, wherein the emission of the EUV radiation source is generated by a Lyman-alpha ($Ly_\alpha$) emission line of lithium at 13.5 nm.

7. The system according to claim 1, wherein the filter for broadband spectral filtering comprises an optical element for broadband spectral filtering which achieves a spectral filtering of better than 0.6 nm at a working wavelength of 13.5 nm.

8. The system according to claim 1, wherein the filter for broadband spectral filtering comprises a combination of a non-EUV SPF filter with individual reflections or multiple reflections of mirrors which are coated with multilayer interference filters and are adjusted such that they reflect a selected working wavelength, wherein the combination can be arranged in any order.

9. The system according to claim 8, wherein the mirrors for the individual reflections or multiple reflections are coated with multilayer interference filters with layer pairs of silicon and molybdenum.

10. The system according to claim 1, wherein the filter for broadband spectral filtering comprises a broadband EUV filter equivalent to multilayer reflection for broadband spectral filtering so that a bandwidth of $\lambda/\Delta\lambda > 500$ is adjusted due to the isolated emission line.

11. The system according to claim 1, wherein the filter for broadband spectral filtering comprises a broadband EUV filter equivalent to multilayer reflection for broadband spectral filtering so that a bandwidth of $\lambda/\Delta\lambda > 1000$ is adjusted due to the isolated emission line.

* * * * *

UNITED STATES PATENT AND TRADEMARK OFFICE
CERTIFICATE OF CORRECTION

PATENT NO. : 11,615,897 B2
APPLICATION NO. : 17/760684
DATED : March 28, 2023
INVENTOR(S) : Rainer Lebert et al.

It is certified that error appears in the above-identified patent and that said Letters Patent is hereby corrected as shown below:

In the Specification

In Column 7, Line 40, delete "$\lambda$," and insert -- $\lambda$ --, therefor.

In Column 12, Line 7, after "wave;", insert -- and --.

In the Claims

In Claim 1, Line 24, delete "an illumination source for illuminating a patterned object" and insert -- optical elements for illuminating a patterned object --.

Signed and Sealed this
Twenty-sixth Day of December, 2023

Katherine Kelly Vidal
*Director of the United States Patent and Trademark Office*